United States Patent [19]
Liu et al.

[11] Patent Number: 5,864,158
[45] Date of Patent: Jan. 26, 1999

[54] TRENCH-GATED VERTICAL CMOS DEVICE

[75] Inventors: Yowjuang W. Liu, San Jose; Donald L. Wollesen, Saratoga, both of Calif.

[73] Assignee: Advanced Micro Devices, Inc., Sunnyvale, Calif.

[21] Appl. No.: 832,657

[22] Filed: Apr. 4, 1997

[51] Int. Cl.[6] .............................. H01L 29/76; H01L 29/94
[52] U.S. Cl. ........................ 257/330; 257/329; 257/347; 257/351; 257/369; 257/374; 257/466
[58] Field of Search .................................. 257/329, 330, 257/347, 351, 369, 374, 466

[56] References Cited

U.S. PATENT DOCUMENTS

| | | | |
|---|---|---|---|
| 4,951,102 | 8/1990 | Beitman et al. | 257/347 |
| 5,443,992 | 8/1995 | Risch et al. | 437/29 |
| 5,581,101 | 12/1996 | Ning et al. | 257/347 |
| 5,627,097 | 5/1997 | Venkatesan et al. | 438/217 |

*Primary Examiner*—Valencia Martin-Wallace
*Attorney, Agent, or Firm*—Jefferson Perkins; Foley & Lardner

[57] ABSTRACT

Complementary metal-oxide-semiconductor (CMOS) transistors (18,22) are formed with vertical channel regions (30,52) on an insulator substrate (14). Highly doped polysilicon gates (44,68) are formed in trenches (36,58) to extend laterally around the channel regions (30,52) as insulatively displaced therefrom by gate insulators (41,62) that are grown on the sidewalls of the trenches (36,58). The transistors (18,22), which are formed in respective mesas (20,24) have deeply implanted source regions (28,50) that are ohmically connected to the semiconductor surface via respective source connector regions (34,70).

19 Claims, 3 Drawing Sheets

5,864,158

TRENCH-GATED VERTICAL CMOS DEVICE

TECHNICAL FIELD OF THE INVENTION

The present invention relates in general to integrated circuits, and more particularly to a vertical complementary metal-oxide-semiconductor (CMOS) device and method for fabricating same.

BACKGROUND OF THE INVENTION

In traditional semiconductor fabrication techniques, integrated circuit devices such as transistors are laid out in a relatively planar, thin film at the surface of a semiconductor substrate. As time has passed, there has been a need to make these devices smaller and smaller, such that they occupy less "real estate" on the surface of the semiconductor chip which they occupy. As the dimensions of the device shrink, barriers to further downsizing begin to appear. For example, the depth of focus on small devices drops dramatically. One encounters line width control problems, alignment problems and problems with contacts. Squares become rounded in their shape; some features may disappear entirely with a loss of focus. Conventionally, the minimum size of a channel length of a transistor is determined by the minimum lithography obtainable by the stepper used to fabricate chips on the wafer. As the minimum channel length decreases, the cost of the stepper increases. A need therefore continues to exist for devices which occupy a small amount of real estate, whose critical dimensions are not controlled by lithographic constraints, and which at the same time have acceptable reliability, cost and operational performance.

SUMMARY OF THE INVENTION

The present invention relates to a device having a transistor channel formed to be approximately perpendicular to the surface of a substrate on which the device is formed. The length of this channel is therefore more independent of lithographic constraints. According to one aspect of the invention, a semiconductor layer is formed on the substrate to be of a first conductivity type. A heavily doped region is formed in the semiconductor layer to be spaced from the surface of the semiconductor layer and to be of a second conductivity type. A drain region is formed adjacent to the semiconductor layer surface and is spaced from an upper boundary of the heavily doped region by a channel region. A sidewall of the channel region extends from the top surface of the channel region at least to the boundary of the heavily doped region, and a gate insulator is formed on this sidewall. A conductive gate is formed adjacent the sidewall. A source voltage is connected to the heavily doped region. In this manner, a vertical channel region is formed between a drain region on the top of the device and a source region that is formed in the semiconductor layer. Preferably, the source voltage is supplied to the semiconductor layer through a source connector region that is formed to extend from the surface of the semiconductor layer to the boundary of the source region.

In one embodiment of the invention, the conductive gate, which for example can be highly doped polysilicon, is formed as a ring or other endless structure to surround that portion of the semiconductor layer that includes the channel region. The source connector region is formed laterally exterior to a trench containing the gate.

This device is preferably built as a mesa of semiconductor material on a substrate insulator (SOI); in a CMOS embodiment, a second device having reversed conductivity types for its components is built in another mesa. The mesas are separated from each other and from other devices by an insulator such as oxide.

Several technical advantages inhere in the device of the invention. There is no hot carrier injection concern, as the channel region conducts current in bulk in its body rather along its surface. The voltage distribution is more uniform. A higher performance is obtained because the horizontal area of the drain region is the same as the cross-sectional area of the channel region, making the effective transistor size larger. The channel length is not controlled by lithography, and thus a channel length of less than L can be obtained, where L is the minimum lithographic feature dimension. This channel region can instead be controlled by diffusion, implanting and etching. The device of the invention has much better reliability than conventional devices, as its voltage distribution is much better and there is no localized high electric field. The device is easier to scale and, because an advanced stepper is not needed, results in reduced manufacturizing costs.

BRIEF DESCRIPTION OF THE DRAWINGS

Further aspects of the invention and their technical advantages will be discerned with reference to the following detailed description when taken in conjunction with the drawings in which.

DETAILED DESCRIPTION OF THE INVENTION

Figure 1:
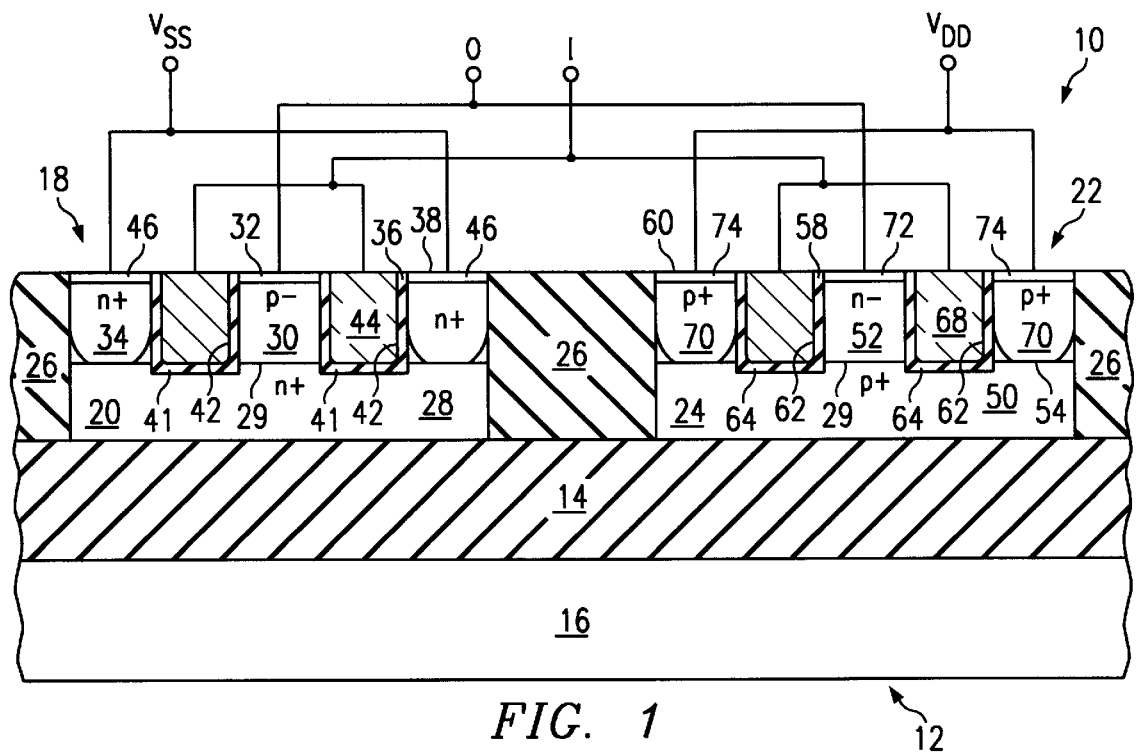
FIG. 1 is a highly magnified schematic cross-sectional view of a CMOS device according to the invention.
Figure 2:
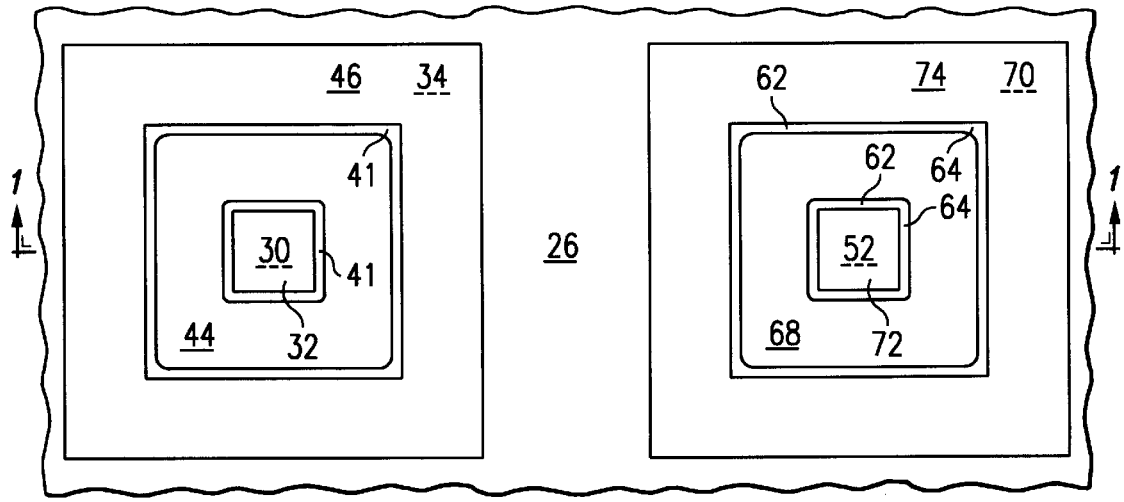
FIG. 2 is a top view of the device shown in FIG. 1, FIG. 1 being a sectional view taken substantially along line 1—1 of FIG. 2.

With reference to FIGS. 1 and 2, a complementary metal-oxide-semiconductor (CMOS) version of the invention is indicated generally at 10. Device 10 is formed on a substrate 12, which preferably includes a layer of oxide 14 that has been formed on a silicon base 16. Alternatively, the substrate 12 can be an undoped bulk silicon or other semiconductor layer. The described embodiment uses silicon as the semiconductor, but other semiconductor materials such as gallium arsenide can be used.

Preferably, the device is composed of an n-channel field effect transistor indicated generally at 18 and formed in a first semiconductor layer or mesa 20, and a second, p-channel field effect transistor 22 formed in a second semiconductor layer or mesa 24. Mesas 20 and 24 are spaced apart by insulator regions 26. Thus, transistors 18 and 22 are completely isolated from each other and other semiconductor devices in all directions. Initially or later, layer 20 is lightly doped to be (p−), and layer 24 is lightly doped to be (n−).

N-channel transistor 18 includes a heavily doped (n+) source region 28 that preferably extends the entire width of the mesa 20. An upper boundary 29 of region 28 is spaced away from a top surface 38 of the layer 20. A vertical channel region 30 is disposed adjacent boundary 29 and spaces region 28 from an (n+) surface drain region 32. A source connector region 34 extends from the top surface 38 to at least boundary 29. A preferably endless or ring-shaped trench 36 is patterned and etched into layer 20 to extend from the top surface 38 of the layer 20 to at least the boundary 29 of source region 28. The sidewalls 42 of the trench 36 laterally define the extent of channel region 30 and provide an extensive area through which an electric field may be imposed. A gate insulator layer 41, which for example can be oxide, nitrided oxide or an oxide-nitride-oxide sandwich, is grown on the bottom and sidewalls 42 of the trench 36.

A conductive gate 44, which is preferably formed of highly doped polycrystalline silicon (poly), is formed within that volume of trench 36 which is left over from the formation of the gate insulator 41. A drain region 32 is formed as by implantation of (n) type dopant to be adjacent surface 38 and to be spaced from source region 28 by channel region 30. A surface source region 46, which is formed at the face 38 of layer 29 and externally laterally of trench 36, can be formed at the same time as drain 32. In the embodiment illustrated in FIGS. 1 and 2, this surface source region is endless or ring-shaped, as is source connector region 34.

The p-channel transistor 22 is essentially the reverse of the n-channel transistor 18. The p-channel transistor has a highly doped (p+) source region 50 with an upper boundary 54 that is spaced from a top surface 60 of the semiconductor layer 24. An (n−) vertical channel region 52 is defined at the center of the device. An endless or ring-shaped trench 58 is patterned and etched to extend from the top surface 60 of the layer 24 to at least a boundary 54 of the (p+) source region 50 (and perhaps slightly entering into region 50, as shown), and a gate insulator 62 is formed on the bottom and sidewalls 64 of the trench 58. A second conductive (preferably highly doped polysilicon) gate 68 is formed within the volume left over by the gate insulator 62 inside the trench 58. A (p+) source connector region 70 is formed so as to extend from the surface 60 of the semiconductor layer 24 to at least the boundary 54 of the source region 50, so as to provide an ohmic contact to this source region from the surface. A (p+) drain region 72 is formed at the surface 60 of the semiconductor 24, along with a (p+) source contact region 74. While the p-channel transistor 22 is schematically shown to be of the same size as the n-channel transistor 18, in actual practice the channel region 52 of transistor 22 will usually be dimensioned to be larger than n-channel transistor 18 to have the same current-carrying capacity.

The electrical contacts made to the various semiconductor regions forming transistors 18 and 22 are shown schematically in FIG. 1. As assembled into a CMOS gate, a voltage $V_{dd}$ is connected to the source contact region 74 of p-channel transistor 22, an input I is connected to the poly gates 44 and 68 of both transistors 18 and 22, and an output O is connected to drain region 72 of p-channel transistor 22, and to drain 32 of the n-channel transistor 18. A source voltage $V_{SS}$ is connected to source region 28 through (n+) source connector region 34 of a n-channel transistor 18.

Figure 3:
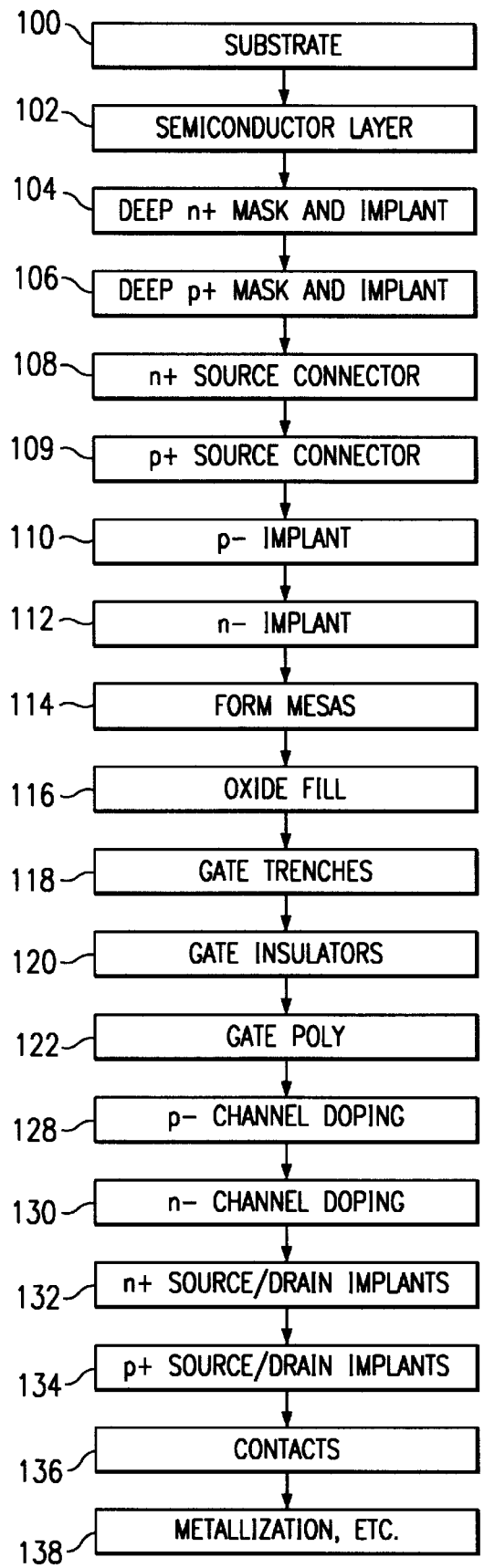
FIG. 3 is a representative process flow diagram for the construction of the device shown in FIGS. 1 and 2.

A representative process for fabricating device 10 is illustrated in the flow diagram of FIG. 3. At a step 100, a substrate is provided. The substrate can be a conventional semiconductor substrate or, as illustrated in FIG. 1, can be a substrate including an oxide or quartz layer 14 on top of a semiconductor layer 16.

At step 102, a semiconductor layer is formed on the oxide layer 14. At step 104, an (n+) implant is performed through a mask to create (n+) source region 28. At step 106, the (n+) source region 28 is covered while a deep (p+) implant is performed on the semiconductor layer to create (p+) source region 50. After these two implants, a diffusion drive-in can be performed after step 106.

At step 108, a source connector mask is applied to the workpiece and an (n+) implant performed at a relatively high energy and high dose to create the (n+) source connector region 34 (FIG. 1). Similarly, at step 109, a further relatively high energy and high dose implant is performed to create (p+) source connector region 70. After step 109, a further diffusion drive-in step can be performed.

At step 110, the semiconductor layer is masked and a (p−) implant is performed in that region of the semiconductor layer that will form the (n−) channel transistor 18. This mask is then removed, and at step 112 a similar (n−) implant is performed on that portion of the semiconductor layer forming p-channel transistor 22.

At step 114, the semiconductor layer is patterned and etched to form mesas 20 and 24, such that islands of semiconductor are isolated from each other by an isolation channel. At step 116, an insulator such as oxide is deposited to form regions 26 that isolate the mesas 20 and 24 from each other and from other structures which may be fabricated on the substrate.

At step 118, endless or ring-shaped trenches 36 and 58 are patterned and anisotropically etched in a timed etch so as to extend completely through the semiconductor layer to at least upper boundaries 40 and 54 of the respective (n+) and (p+) source regions (see FIG. 1). The trenches can be slightly deeper than this, as shown. Once trenches 30 and 58 are formed at step 120, gate insulators 41 and 62 are grown on the bottoms of the trenches and on the sidewalls 42 and 64 thereof. The gate insulators may be straight oxide, nitrided oxide or may be formed of a trilayer of oxide, nitride and oxide for increased reliability. At step 122, poly is deposited across the face of the workpiece so as to fill the trenches 36 and 58. The excess poly may be removed by chemical/mechanical polishing (CMP) to produce a planar top surface of the structure and separated ring-shaped transistor gates.

At step 128, one or more masked implants are performed on the p-channel region 52, such as a threshold voltage adjust implant and a punch-through prevention implant. Similarly, $V_t$ adjust and punch-through prevention implants are performed on the n-channel region 30 at step 130. At step 132, a source/drain implant is performed with an (n) type dopant to create (n+) drain 32 as well as (n+) top source region 46. At step 134, a similar (p) source/drain implant is performed to create (p+) drain 72 and (p+) top source contact region 74. Both of these source/drain implant steps are performed through appropriate masks.

At step 136, contacts are made to surface source region 46, drain 32, gate 44, surface source region 74, drain 72 and gate 68. Finally, at step 138, appropriate metallization and passivation steps are carried out to complete the semiconductor device.

FIG. 3 illustrated only one possible fabrication method, and FIGS. 1 and 2 illustrate only one possible embodiment of the invention. In an alternative embodiment, a semiconductor layer may be formed on the oxide layer 14, and an epitaxial layer formed on the buried semiconductor layer. The base or buried semiconductor layer may be highly doped in order to create the source regions as shown prior to the growth of the subsequent epitaxial layer.

Figure 4:
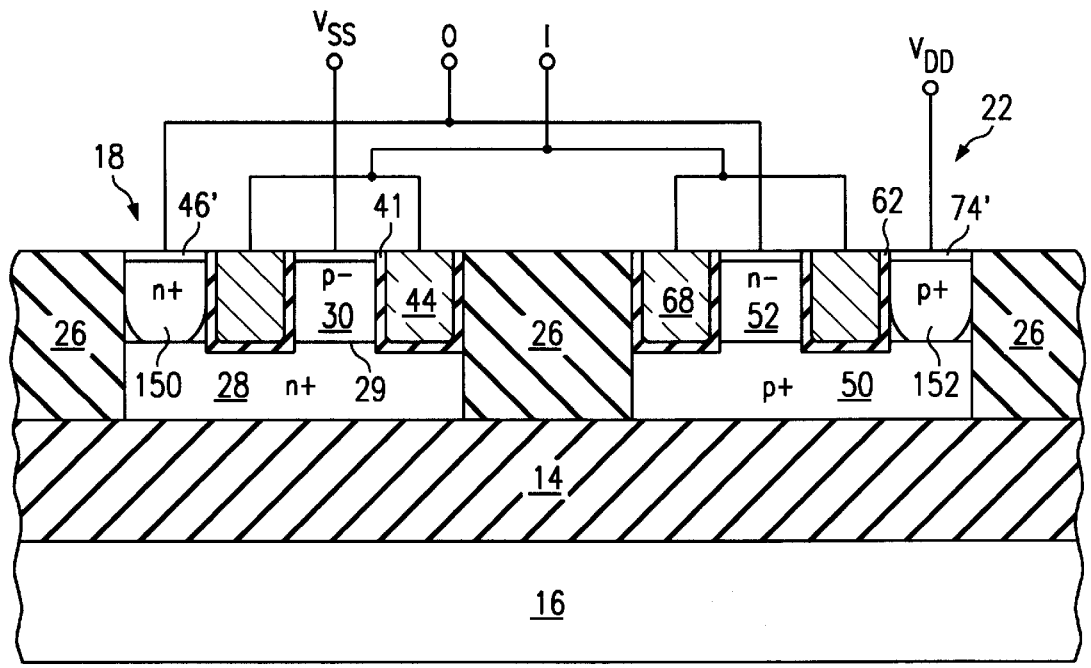
FIG. 4 is a high magnified schematic cross-sectional view of an alternative embodiment of the invention.
Figure 5:
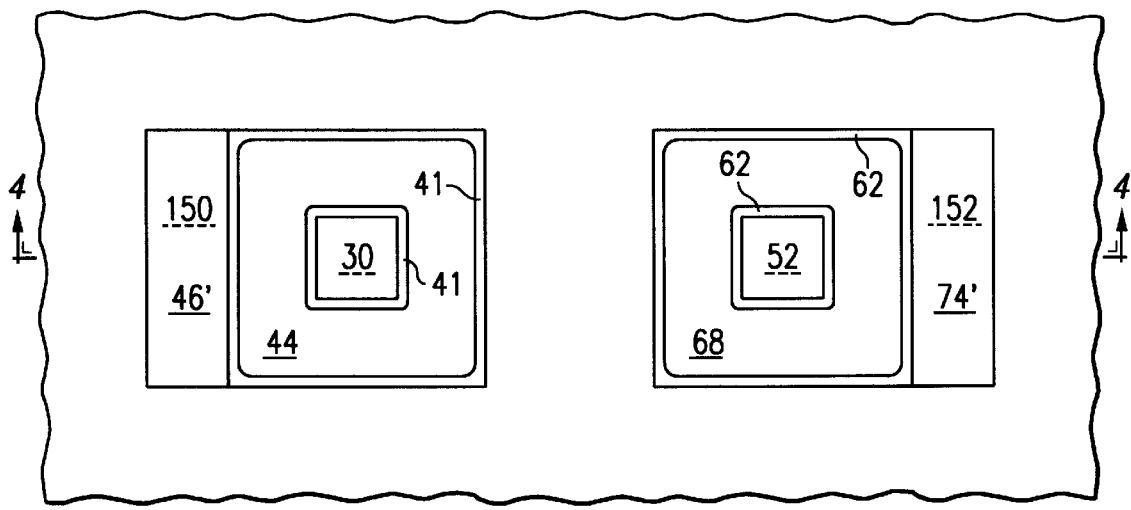
FIG. 5 is a top view of the device shown in FIG. 4, FIG. 4 being a sectional view taken substantially along line 4—4 of FIG. 5.

A further embodiment of the invention is illustrated in FIGS. 4 and 5, in which like characters identify like parts with respect to FIGS. 1 and 2. In the n-channel transistor 18, the (n+) source region 28 is not as laterally extensive as its counterpart in FIG. 1. An (n+) source connector region 150 is formed as a bar (FIG. 5) rather than as an annular region. The source connector region 150 is nonetheless sufficient to make ohmic connection to the source region 28. Similarly, a (p+) source connector region 152 is provided as a component of the (p+) channel transistor 22. In the top view, the source connector region 152 takes the shape of an elongated rectangle or bar, as is shown in FIG. 5. The (p+) source connector region 152 makes ohmic contact with the (p+) source region 50.

In a further embodiment (not shown), the source regions 28 and 50 may laterally extend only between the respective vertical channel regions 30 and 52 and the respective source connector regions 150 and 152. Further, the source connector regions 150 and 152 may be reduced in lateral extent to be only sufficient to receive a contact. In place of oxide isolation regions 26 being formed by filled trenches, a LOCOS process may be used.

In summary, a vertical-channel SOI CMOS device has been shown and described. The device exhibits bulk conduction, more uniform voltage distribution and a channel length which is not limited by lithography.

While a preferred embodiment of the invention has been described in the detailed description and illustrated in the accompanying drawings, the invention is not limited thereto but only by the scope and spirit of the appended claims.

What is claimed is:

1. A vertical insulated-gate field-effect transistor, comprising:
   a substrate;
   a semiconductor layer formed on said substrate to be of a first conductivity type and having a surface;
   a heavily doped region formed in said semiconductor layer to be spaced from said surface of said semiconductor layer and to be of a second conductivity type opposite said first conductivity type, said heavily doped region having a boundary, a channel region of said semiconductor layer disposed adjacent to said boundary of said heavily doped region;
   a drain region formed adjacent said surface of said semiconductor layer to be spaced from said heavily doped region by said channel region and to be of said second conductivity type;
   an endless sidewall of said channel region extending from said surface of said semiconductor layer to at least said boundary of said heavily doped region;
   a gate insulator formed to adjoin said sidewall;
   a conductive gate formed adjacent said sidewall so as to laterally surround said channel region; and
   means for impressing a source voltage on said heavily doped region.

2. The transistor of claim 1, wherein said means for impressing said source voltage on said heavily doped region is a source contact region formed in said semiconductor layer to be of said second conductivity type, said source contact region spaced from said channel region.

3. The transistor of claim 2, wherein said source contact region is formed to be insulatively adjacent said gate.

4. The transistor of claim 1, wherein said substrate is an insulator.

5. A vertical insulated-gate field-effect transistor, comprising:
   a substrate;
   a semiconductor layer formed on said substrate to be of a first conductivity type and having a surface spaced from said substrate;
   a heavily doped region formed in said semiconductor layer, a boundary of said heavily doped region spaced from said surface of said semiconductor layer, said heavily doped region being of a second conductivity type opposite said first conductivity type;
   a channel region defined in said semiconductor layer to have said first conductivity type and being formed adjacent said boundary of said heavily doped region;
   a drain region formed adjacent said channel region to be spaced from said boundary of said heavily doped region, to be adjacent said surface of said semiconductor layer and to be of said second conductivity type;
   an endless trench formed in said semiconductor layer to extend from said surface of said semiconductor layer to at least said boundary of said heavily doped region and having a sidewall adjacent said channel region; and
   a conductive gate formed in said trench to be disposed insulatively adjacent said sidewall and to laterally surround said channel region.

6. The transistor of claim 5, wherein said gate is highly doped polycrystalline silicon.

7. The transistor of claim 5, and further comprising a source connector region extending from said surface of said semiconductor layer to at least said boundary of said heavily doped region, said source connector region being insulatively spaced from said gate and being opposed to said channel region, said source connector region being doped to be of said second conductivity type.

8. The transistor of claim 5, wherein said substrate includes a dielectric layer disposed adjacent to said heavily doped region.

9. The transistor of claim 5, wherein said semiconductor layer is formed as a mesa of semiconductor material.

10. The transistor of claim 9, wherein said mesa has sidewalls, said mesa being laterally isolated by regions of dielectric material disposed adjacent said sidewalls of said mesa.

11. A complementary field effect transistor device, comprising:
    a substrate;
    a first semiconductor layer formed on a first area of said substrate to be of a first conductivity type and having a top surface;
    a first heavily doped region formed in said first semiconductor layer to have an upper boundary spaced from said top surface of said first semiconductor layer and to be of a second conductivity type opposite said first conductivity type, a first channel region of said first semiconductor layer to be of said first conductivity type;
    a first drain region formed in said first semiconductor layer adjacent said top surface of said first semiconductor layer and to be spaced from said heavily doped region of said first semiconductor layer by said first channel region, said first drain region formed to be of said second conductivity type;
    at least one sidewall of said first channel region extending from said first drain region to at least said upper boundary of said heavily doped region;
    a first gate insulator formed on said sidewall;
    a first conductive gate formed adjacent said sidewall opposite said first channel region;

a second semiconductor layer formed on a second area of said substrate and having a top surface;

a second heavily doped region formed in said second semiconductor layer to be of said first conductivity type, an upper boundary of said second heavily doped region spaced from said top surface of said second semiconductor layer, a second channel region of said second semiconductor layer having said second conductivity type, the second channel region having a length dimension which is different than a length dimension of the first channel region;

a second drain region formed adjacent said top surface of said second semiconductor layer and to be spaced from said second heavily doped region by said second channel region and to be of said first conductivity type;

at least one sidewall of said second channel region extending from said second drain region to said upper boundary of said second heavily doped region;

a second gate insulator formed on said sidewall of said second channel region;

a second conductive gate formed adjacent said second gate insulator;

means for impressing a drain voltage on said first drain region;

means for impressing a source voltage on said second heavily doped region;

means for conductively coupling together said first heavily doped region with said second drain region; and means for conductively coupling together said first and second gates.

12. The device of claim 11, wherein said means for impressing a source voltage on said second heavily doped region comprises a source connector region extending from said top surface of said second semiconductor layer to said second heavily doped region; said source connector region being of said first conductivity type.

13. The device of claim 11, wherein said means for conductively coupling said first heavily doped region with said second drain region comprises a connector region formed in said first semiconductor layer to be of said second conductivity type and to extend from at least said upper boundary of said first heavily doped region to said top surface of said first semiconductor layer.

14. The device of claim 11, wherein said first semiconductor layer is formed in a first mesa, said second semiconductor layer being formed in a second mesa spaced from said first mesa.

15. A vertical insulated-gate field-effect transistor, comprising:

a substrate;

a semiconductor layer formed on said substrate to be of a first conductivity type and having a surface;

a heavily doped region formed in said semiconductor layer to be spaced from said surface of said semiconductor layer and to be of a second conductivity type opposite said first conductivity type, said heavily doped region having a boundary, a channel region of said semiconductor layer disposed adjacent to said boundary of said heavily doped region;

a drain region formed adjacent said surface of said semiconductor layer to be spaced from said heavily doped region by said channel region and to be of said second conductivity type;

at least one sidewall of said channel region extending from said surface of said semiconductor layer to at least said boundary of said heavily doped region;

a gate insulator formed to adjoin said sidewall;

a conductive gate formed adjacent said sidewall opposite said channel region, said drain region being self-aligned to said conductive gate; and means for impressing a source voltage on said heavily doped region.

16. The transistor of claim 15, wherein said sidewall is endless, said gate laterally surrounding said channel region.

17. The transistor of claim 15, wherein said means for impressing said source voltage on said heavily doped region is a source contact region formed in said semiconductor layer to be of said second conductivity type, said source contact region spaced from said channel region.

18. The transistor of claim 15, wherein said source contact region is formed to be insulatively adjacent said gate.

19. The transistor of claim 15, wherein said substrate is an insulator.

* * * * *